United States Patent [19]

Chambers

[11] 4,283,787

[45] Aug. 11, 1981

[54] CYCLIC REDUNDANCY DATA CHECK ENCODING METHOD AND APPARATUS

[75] Inventor: John P. Chambers, Crawley, England

[73] Assignee: British Broadcasting Corporation, London, England

[21] Appl. No.: 64,188

[22] Filed: Aug. 6, 1979

[30] Foreign Application Priority Data

Nov. 6, 1978 [GB] United Kingdom ............... 43357/78
May 2, 1979 [GB] United Kingdom ............... 15250/79

[51] Int. Cl.³ .......................................... G06F 11/10
[52] U.S. Cl. ................................................... 371/38
[58] Field of Search ................................... 371/38, 37

[56] References Cited

U.S. PATENT DOCUMENTS

| | | | |
|---|---|---|---|
| 3,601,800 | 8/1971 | Lee ................................... | 371/38 X |
| 4,005,405 | 1/1977 | West ................................. | 371/38 |
| 4,044,329 | 8/1977 | Besenfelder et al. ............. | 371/38 X |
| 4,077,565 | 3/1978 | Nibby, Jr. et al. ................. | 371/38 |

OTHER PUBLICATIONS

Chien, "Memory Error Control: Beyond Parity," *IEEE Spectrum*, Jul. 1973, pp. 18–23.
Oldham et al., "Cyclical Redundancy Check with a Nonself-Reciprocal Polynomial," *IBM Technical Disclosure Bulletin*, vol. 16, No. 11, Apr. 1974, pp. 3501–3503.

*Primary Examiner*—David H. Malzahn
*Attorney, Agent, or Firm*—Robert F. O'Connell

[57] ABSTRACT

A cyclic redundancy check word is customarily placed at the end of a data block, occupying one or more of the last bytes of the block. This can impose an undesirable restraint upon the person composing the data block, e.g. the editor of a teletext page. The invention allows the check word effectively to be embedded anywhere convenient in the block. A location in the block is selected (one or more bytes—preset address 16) and all preceding bytes are cyclically encoded (encoder 18) to yield a first check word. The succeeding bytes are subjected in reverse order to complementary encoding (encoder 28) to yield a second check word. A third check word is formed from the first and second check words (encoding logic 32) and inserted in the selected location. Each bit of the third word is the logical product of the corresponding bit of the first word and selected bits of the second word, such that when the bytes of the complete block, including the third word, are cyclically encoded, the final check word has the required final form, e.g. all zeroes, to indicate compliance of the block with the cyclic redundancy check. The location can be selected by the editor but is preferably selected automatically by a search for a free location complying with predetermined conditions.

3 Claims, 1 Drawing Figure

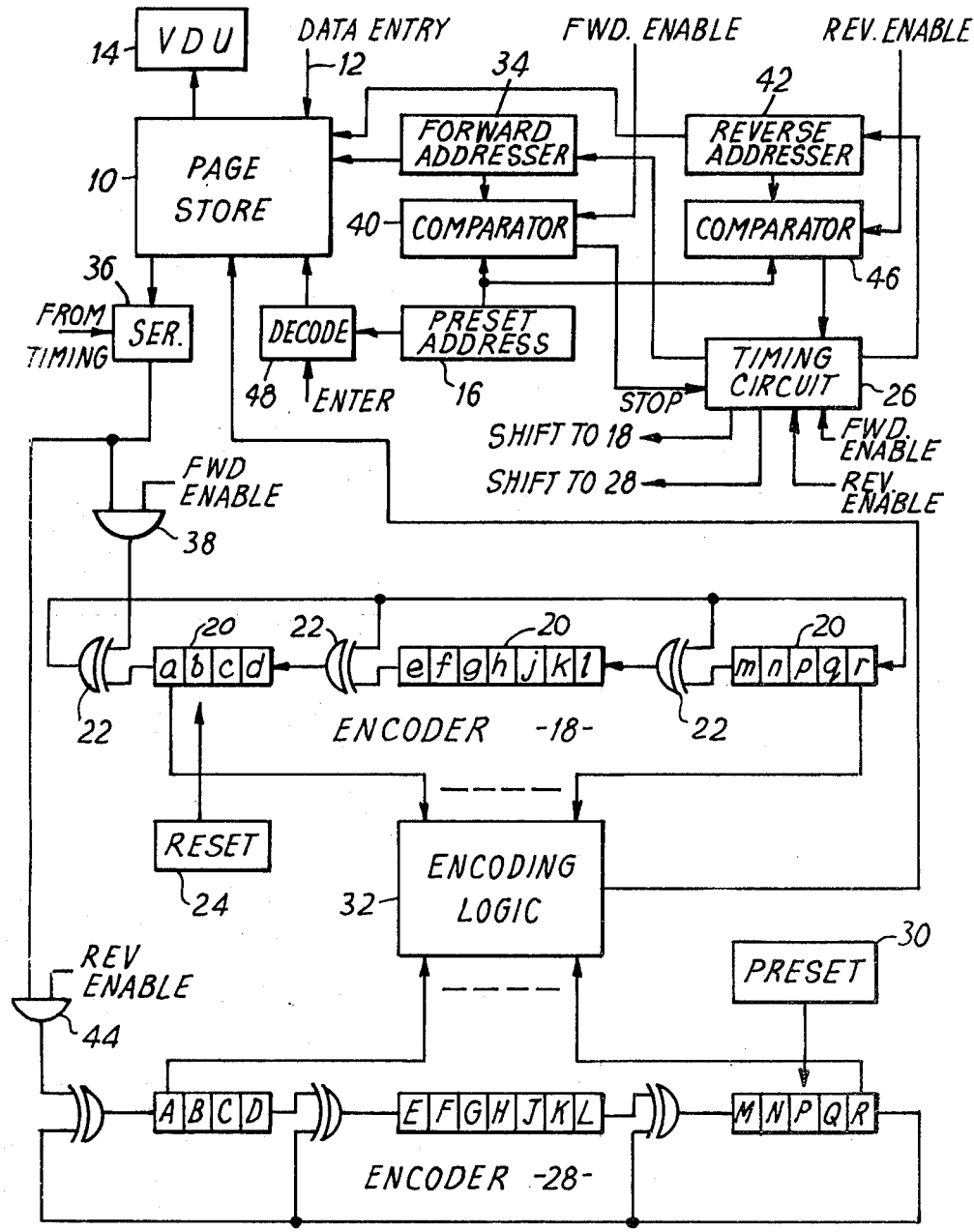

CYCLIC REDUNDANCY DATA CHECK ENCODING METHOD AND APPARATUS

The use of cyclic redundancy check codes, referred to more briefly herein as check words, is well known as a means of protecting blocks of binary data when errors in one or more received bits cannot be tolerated. The check words can be used in ways well known in themselves, and forming no part of this invention, to correct some errors and detect other errors (which require re-transmission of the data block). An encoder is used to generate the check word for a block and this check word is transmitted along with the block. At the receiver the same encoding operation is performed on the received block plus check word and the result is a final check word which has a predetermined form, e.g. all zeroes, if the block has been received without error.

One example of the use of this technique is in teletext data transmission. In the standards currently adopted in the United Kingdom a data block is a page consisting of 24 lines numbered 0 to 23, each comprising 40 8-bit characters. The data block which is encoded may be restricted to lines 1 to 23 or to these lines plus only part of line 0 since line 0 is the "page header" which can contain rapidly changing time information. (See Broadcast Teletext Specification, September 1976 published jointly by British Broadcasting Corporation and others.) To take the case of just lines 1 to 23 there are 23×40 8-bit words, i.e. 920 words, for which a 16-bit check word suffices. This check word is inserted in the data block itself as two data words, i.e. two characters, at the end of line 23.

The requirement always to assign these two characters to the check word can be a troublesome constraint on the editor setting up a page and the object of this invention is to provide an apparatus and method which enables the check word to be effectively embedded anywhere in the data block. The editor can then place the check word where it will not matter so far as the ultimate use of the data block is concerned.

The apparatus and method according to the invention are defined in claims 1 and 2.

The invention will be described in more detail, by way of example, with reference to the accompanying drawings, in which:

The sole FIGURE is a block diagram of an encoder embodying the invention.

In the FIGURE all connections are shown simply as single lines. Obviously many of these lines represent bit-parallel, multiple lines.

The apparatus shown in the FIGURE comprises a page store 10 in which 24 lines of 40 8-bit characters (each including a parity bit) are stored. The editor has conventional means comprising at least a keyboard for entering data as indicated by the line 12 labelled DATA ENTRY. The store is coupled to a conventional visual display unit (VDU) 14 which is used by the editor to monitor what he is setting up and in particular to see where he can conveniently insert a check word.

The data block to be encoded consists of lines 1 to 23 and the characters thereof will be considered as having addresses 1 to 920. (In practice the addresses may be 41 to 960 because of the existence of line 0 but this is a trival matter merely requiring 40 to be added to the addresses considered below). The place where a check word is to be inserted is identified by the address X which can be preset by the editor in a preset address register 16. Since the check work occupies 16 bits it occupies character addresses X and X+1. Although the constraint could be imposed that X is always odd, in general it may be odd or even and can have any value from 1 to 919.

Briefly, and before continuing with the description of the FIGURE, the apparatus determines a first check word forward through characters 1 to X−1 and a second check word working backwards with reverse encoding through characters 920 to X+2 and then determines what third word, when inserted at X and X+1 will join up the sequence in such a way that forward encoding through all characters 1 to 920 will result in the correct final check word, e.g. all zeroes. The word thus determined is written into the store at X and X+1 in place of whatever characters originally exist there. The third word can always be uniquely determined so that when the cyclic encoding proceeds from the first word to the third word, the second word results.

The forward encoding is performed by a check word encoder 18 of known form. This encoder consists of a 16-bit register split into three shift registers 20 and three exclusive OR gates 22. Before any encoding operation is started the register is reset to all zeroes as schematically indicated by block 24. Characters 1 to X−1 are then clocked into the register under control of a timing circuit 26 incorporating a clock pulse generator and the first check word denoted by bits a b c d e f g h j k l m n p q r then exists in the register. The reverse encoding is performed by a check word encoder 28 which will be recognised as complementary to the encoder 18. Before any encoding operation is started the register 28 is preset to the required final check word as schematically indicated by block 30. The preset operation will again be reset to all zeroes if the final check word is to be all zeroes. Characters 920 to X+2 are then clocked, in that order, into the register 28 under control of the circuit 26 and the aforementioned second check word denoted by bits A B C D E F G H J K L M N P Q R then exists in that register.

Encoding logic 32 then generates the bits of the check word required to be inserted at X and X+1 by operating on the bits a to r and A to R. For the form of encoder 18 (and complementary encoder 28) it can be shown that the required word, denoted a' b' c' d' e' f' g' h' j' k' l' m' n' p' q' r' is established by the following table:

| | |
|---|---|
| a' | = a. A. F. L. N. R |
| b' | = b. B. G. M. P |
| c' | = c. C. H. N. Q |
| d' | = d. D. J. P. R |
| e' | = e. A. E. F. K. L. N. Q. R |
| f' | = f. B. F. G. L. M. P. R |
| g' | = g. C. G. H. M. N. Q |
| h' | = h. D. H. J. N. P. R |
| j' | = j. E. J. K. P. Q |
| k' | = k. F. K. L. Q. R |
| l' | = l. G. L. M. R |
| m' | = m. A. F. H. L. M. R |
| n' | = n. B. G. J. M. N |
| p' | = p. C. H. K. N. P |
| q' | = q. D. J. L. P. Q |
| r' | = r. E. K. M. Q. R |

If the word thus defined is inserted at the locations X and X+1 and if the whole data block (characters 1 to 920) is then clocked through an encoder constructed as encoder 18, the check word in the register at the end of the operation will, if there are no errors, consist of the final check word to which the encoder of register 28 was preset, e.g. all zeroes. The table given above is worked out for the particular encoder 18 shown. Equivalent tables can be worked out for other encoder configurations. The cyclic check upon which the encoders 18 and 28 and the above table are based is that internationally agreed in CCITT Recommendation V41. The check word need not consist of two characters (bytes). Depending upon the length of the data block and the form of the cyclic check, it may consist of one byte or more than two bytes.

In the above table, the product dots represent products modulo 2, i.e. exclusive OR functions. Accordingly the encoding logic 32 can be hard-wired as trees of exclusive OR gates, one tree for each of the bits a' to r'. However various equivalent techniques will be apparent. One is to count the number of "1" bits in each product function. If the number is odd, the bit of the required word is 1, if even, the bit of the required word is 0. This technique, i.e. counting modulo 2, might be convenient in a software implementation, (see below).

If desired further constraints may be imposed upon the inserted check word. For example the check word may only be acceptable for insertion if its two constituent characters have the same parity as the characters in general, i.e. odd parity in the case of the U.K. teletext system. Coversely the constituent characters may be required to have opposite parity to the data characters. In some teletext receivers this will automatically prevent display of such characters.

The remainder of the drawing merely illustrates one way in which the necessary operations could be controlled. The editor chooses the address X to enter in the register 16. It is also assumed, purely in the interests of simplicity, that the editor also provides various control signals, e.g. by pushing buttons. In practice it can be arranged to effect control in a fully automated sequence, each operation being initiated by completion of the previous operation. Moreover the control functions can equally be effected by suitably programming a controlling micro-processor and all the encoders could be implemented by processor software. Regardless of how the encoders 18 and 28 are implemented, they do not nessarily operate bit-serially; equivalent bit-parallel check word encoders are known.

Reverting then to the drawing, the editor firstly presets X in the register 16 and then presses a button to generate a FORWARD ENABLE signal. This signal causes the timing circuit 26 to send groups of 8 shift pulses to the shift registers 20 and to send one pulse per group to a forward addresser 34. This comprises a conventional adress counter and decoder and addresses word locations 1, 2, 3 etc. in the store 10. The words thus read out are serialized by a serializer 36 synchronised to the shift pulses and fed to the encoder 18 through an AND gate 38 enabled by FORWARD ENABLE. FORWARD ENABLE also enables a comparator 40 connected to the forward address counter and the register 16 and constructed to provide a STOP signal immediately the number in the address counter goes to X so that the last word read out is word X−1. The STOP signal stops the timing circuit 26 and at this stage the aforesaid first check word will be in the register of the encoder 18.

The editor now presses another button to signal REVERSE ENABLE. The timing circuit 26 then applies shift pulses to the register of the encoder 28 and pulses a counter in a reverse addresser 42, constructed to count from 920 downwardly. A gate 44 is enabled to pass the serialized characters to the encoder 28 and a comparator 46 is enabled. This issues its STOP signal to the timing circuit 26 as soon as the number in the reverse address counter goes to X+1 so that the last word read out is word X+2. The second check word is in the register of the encoder 28.

Assuming the encoding logic 32 consists of trees of OR gates, the check word a' to r' is now present (in bit-parallel form) on the output of the matrix. The editor presses an ENTER button and the check word is entered, e.g. as two 8-bit bytes in sequence, at the addresses X and X+1 provided by an address decoder 48 connected to the register 16. The same ENTER signal can be used, after a short delay, to reset the address counters and to reset and preset the registers in the encoders 18 and 28.

The circuitry at the receiving terminal is conventional, comprising an encoder identical to the encoder 18. When the received data block has all been fed into the encoder, the final word therein should agree with the preset word initially put in the encoder 28 at the transmitting terminal, e.g. all zeroes. Error correction/detection circuits are connected to the receiver encoder to perform their customary functions when there is lack of agreement.

The editor now has several hundred options as to where to locate what is effectively a check word, namely a word which makes the data block as a whole conform to a particular cyclic redundancy check. Which location is chosen will depend upon editorial constraints and any system constrains which are imposed, e.g. relating to parity. Since the invention has been considered largely in terms of teletext, where the invention is particularly useful as the editorial constraints in fact allow much flexibility, the term character has been employed. In the following claims the more general term byte is employed, as the invention can be used in relation to data other than teletext data.

For simplicity, the invention has so far been described in terms of a manual address preset by means of block 16, i.e. editorial selection of locations X and X+1. Preferably however, this selection is performed automatically by scanning the data block to find a free location satisfying prearranged constraints. For example, several rows of words on a teletext page are typically short rows and the check word a'-r' which appears as two innocuous control characters in the emply end of any such row will be acceptable.

The data entry on line 12 will by typically from a computer controlling format, etc. as in many known text-composing systems. The computer can include a simple research program which looks for two adjacent bytes which satisfy the constraints, firstly that they are unoccupied and are therefore free for the check word and secondly that the introduction of the check word there will not lead to undesirable results at receiver.

I claim:

1. Cyclic redundancy check data encoding apparatus comprising a multi-word memory for storing a block of data,
input means for entering a block of data into the memory, addressing means operative to provide an address designating a selected part of the stored block in the memory,
an encoder,
means for reading words from the memory to the encoder for encoding the words preceding the said selected part designated by the addressing means, the encoder including a register and being constructed to provide a first check word in the register of the encoder, a complementary encoder, means for reading words from the memory to the complementary encoder for encoding, in reverse order, the words succeeding the said selected part designated by the addressing means, the complementary encoder including a register and being constructed to provide a second check word in the register of the complementary encoder, encoding logic responsive to the first and second check words in the registers to generate a third check word, and means responsive to the encoding logic and the addressing means for entering the third check word in the memory to occupy the selected part of the block of data designated by the addressing means.

2. A method of processing a multi-word block of data to render the block consistent with a given cyclic redundancy check, comprising the steps of cyclically encoding the words preceding a predetermined part of the block to generate a first check word, cyclically encoding the words succeeding the said part of the block in reverse order and with complementary encoding to generate a second check word, generating a third check word from the first and second check words, and introducing the third check word into the said part of the block, and wherein the step of generating the third word comprises forming the bits of the third word in accordance with predetermined logical functions of bits of the first and second words such that when the whole block, including the introduced third word, is cyclically encoded, the final check word thereby generated has a predetermined form.

3. A method according to claim 2, and further including the step of automatically scanning the block to select a free location for the introduced check word, thereby predetermining the said part of the block.

* * * * *